(12) United States Patent
Zeltser et al.

(10) Patent No.: US 8,218,270 B1
(45) Date of Patent: Jul. 10, 2012

(54) CURRENT-PERPENDICULAR-TO-THE-PLANE (CPP) MAGNETORESISTIVE (MR) SENSOR WITH IMPROVED HARD MAGNET BIASING STRUCTURE

(75) Inventors: Alexander M. Zeltser, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 13/077,815

(22) Filed: Mar. 31, 2011

(51) Int. Cl.
*G11B 5/39* (2006.01)

(52) U.S. Cl. .................................. 360/324.12

(58) Field of Classification Search ........ 360/324–324.2
See application file for complete search history.

(56) References Cited

U.S. PATENT DOCUMENTS 7,327,540 B2  2/2008  Li et al.
7,433,162 B2 * 10/2008  Carey et al. ............. 360/324.11
2009/0274931 A1  11/2009  Qiu et al.
2010/0047627 A1  2/2010  Yuan et al.
2010/0214696 A1 *  8/2010  Matsuzawa et al. ....... 360/235.4
2011/0235216 A1 *  9/2011  Lin ............................... 360/324

* cited by examiner

*Primary Examiner* — Will J Klimowicz
(74) *Attorney, Agent, or Firm* — Thomas R. Berthold

(57) ABSTRACT

A hard magnet biasing structure for a CPP-GMR or CPP-TMR read head for a magnetic recording disk drive is located between the two sensor shields and abutting the side edges of the sensor free layer. An insulating layer is located between the biasing structure and the lower shield and the side edges of the free layer. The biasing structure includes a seed layer of either Ir or Ru, a layer of ferromagnetic chemically-ordered FePt alloy hard bias layer on the seed layer, and a Ru or Ru/Ir capping layer on the FePt alloy hard bias layer. The FePt alloy has a face-centered-tetragonal structure with its c-axis generally in the plane of the layer. The relatively thin seed layer and capping layer allow the biasing structure to be made very thin while still permitting the FePt alloy hard bias layer to have high coercivity ($H_c$), a high remanent magnetization-thickness product ($M_r t$) and a high squareness ($S=M_r t/M_s$).

21 Claims, 5 Drawing Sheets

CURRENT-PERPENDICULAR-TO-THE-PLANE (CPP) MAGNETORESISTIVE (MR) SENSOR WITH IMPROVED HARD MAGNET BIASING STRUCTURE

BACKGROUND OF THE INVENTION

1. Field of the Invention

The invention relates generally to a current-perpendicular-to-the-plane (CPP) magnetoresistive (MR) sensor that operates with the sense current directed perpendicularly to the planes of the layers making up the sensor stack, and more particularly to a CPP MR sensor with an improved hard magnet biasing structure for longitudinally biasing the sensor free layer.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field is detectable as a change in electrical resistance. If the sense current is directed perpendicularly through the planes of the layers in the sensor stack, the sensor is referred to as a current-perpendicular-to-the-plane (CPP) sensor.

In addition to CPP-GMR read heads, another type of CPP MR sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu. In a CPP-TMR read head the nonmagnetic spacer layer is formed of an electrically insulating material, such as $TiO_2$, MgO or $Al_2O_3$.

The sensor stack in a CPP MR read head is located between two shields of magnetically permeable material that shield the read head from recorded data bits on the disk that are neighboring the data bit being read. The sensor stack has an edge that faces the disk with a width referred to as the track width (TW). The sensor stack has a back edge recessed from the edge that faces the disk, with the dimension from the disk-facing edge to the back edge referred to as the stripe height (SH). The sensor stack is generally surrounded at the TW edges and back edge by insulating material.

A layer of hard or high-coercivity ferromagnetic material is used as a "hard bias" layer to stabilize the magnetization of the free layer longitudinally via magneto-static coupling. The hard bias layer is deposited as an abutting junction onto insulating material on each side of the TW edges of the sensor. The hard bias layer is required to exhibit a generally in-plane magnetization direction with high anisotropy ($K_u$) and thus high coercivity ($H_c$) to provide a stable longitudinal bias that maintains a single domain state in the free layer so that the free layer will be stable against all reasonable perturbations while the sensor maintains relatively high signal sensitivity. The hard bias layer must have sufficient in-plane remanent magnetization ($M_r$), which may also be expressed as $M_r t$ since $M_r$ is dependent on the thickness (t) of the hard bias layer. $M_r t$ must be high enough to assure a single magnetic domain in the free layer but not so high as to prevent the magnetic field in the free layer from rotating under the influence of the magnetic fields from the recorded data bits. High $M_r t$ is important because it determines the total flux that emanates from the hard bias layer towards the free layer for a given SH. As t decreases with smaller shield-to-shield spacing it is even more important to have high $M_r$. Moreover, to achieve a high $M_r$, a hard bias material with both a high saturation magnetization ($M_s$) and high squareness (S) is desired, i.e., $S=M_r/M_s$ should approach 1.0.

The conventional hard bias layer is typically a CoPt or CoPtCr alloy with $H_c$ typically less than about 2000 Oe. The desired magnetic properties are achieved by a seed layer or layers directly below the hard bias layer, such as seed layers of CrMo, CrTi and TiW alloys, and bilayers, including NiTa/CrMo and Ta/W bilayers. The hard bias structure, i.e., the hard bias layer and its seed layer or layers, should be as thin as possible while assuring magnetic stabilization of the free layer. This is because as the data density increases in magnetic recording disk drives, there is a requirement for a decrease in the read head dimensions, particularly the shield-to-shield spacing.

More recently a chemically-ordered FePt alloy based on the $L1_0$ phase has been proposed as the hard bias layer. The FePt alloy as deposited is a face-centered-cubic (fcc) disordered alloy with relatively low $K_u$ (approximately $10^5$ erg/cm$^3$), but after annealing is a face-centered-tetragonal (fct) phase ($L1_0$ phase) chemically-ordered alloy with high $K_u$ (approximately $10^7$ erg/cm$^3$). However, the chemically-ordered $L1_0$ phase FePt alloy requires high-temperature deposition (>400° C.) or high-temperature annealing (>500° C.), which are not compatible with current recording head fabrication processes. US 2009/027493 A1 describes a FePt hard bias layer with a Pt or Fe seed layer and a Pt or Fe capping layer, wherein the Pt or Fe in the seed and capping layer and the FePt in the hard bias layer interdiffuse during annealing, with the annealing temperature being about 250-350° C. U.S. Pat. No. 7,327,540 B2 describes a FePtCu hard bias layer, with Cu being present up to about 20 atomic percent, wherein chemical ordering occurs at an annealing temperature of about 260-300° C. However, alloying FePt with nonmagnetic elements such as Cu is undesirable because it reduces $M_s$ and thus for a given S, it reduces $M_r$.

What is needed is a CPP MR sensor with an improved hard magnet biasing structure that has a chemically-ordered $L1_0$ phase FePt alloy hard bias layer without additional alloying elements and that can be made very thin at a temperature compatible with the sensor fabrication processes.

SUMMARY OF THE INVENTION

This invention relates to a hard magnet biasing structure for a magnetoresistive (MR) sensor, such as a CPP-GMR or CPP-TMR read head for a magnetic recording disk drive. The structure is located between the two sensor shields and abutting the side edges of the sensor free layer. An insulating layer is located between the biasing structure and the lower shield and the side edges of the free layer. The biasing structure includes a seed layer of either Ir or Ru, a layer of ferromagnetic chemically-ordered FePt alloy hard bias layer on the seed layer, and a Ru or Ru/Ir capping layer on the FePt alloy hard bias layer. The Ir or Ru seed layer has a thickness preferably equal to or greater than 10 Å and less than or equal to 25 Å, the FePt alloy hard bias layer has a thickness preferably equal to or greater than 130 Å and less than or equal to 200 Å, and the Ru or Ru/Ir capping layer has total thickness preferably equal to or greater than 40 Å and less than or equal to 100 Å. The FePt alloy has a face-centered-tetragonal structure with its c-axis generally in the plane of the layer. Prior to annealing the composition of the FePt alloy is $Fe_{(100-x)}Pt_x$ where x is atomic percent and is preferably greater than or equal to 43 and less than or equal to 48.

The thin Ru or Ir seed layers and Ru or Ru/Ir capping layer allow the biasing structure to be made very thin while still permitting the FePt alloy hard bias layer to have high $H_c$ (up to about 4500 Oe), a high $M_r t$ (up to about 1.4 memu/cm$^2$) and a high squareness S (up to about 0.89).

For a fuller understanding of the nature and advantages of the present invention, reference should be made to the following detailed description taken together with the accompanying figures.

DETAILED DESCRIPTION OF THE INVENTION

Figure 1:
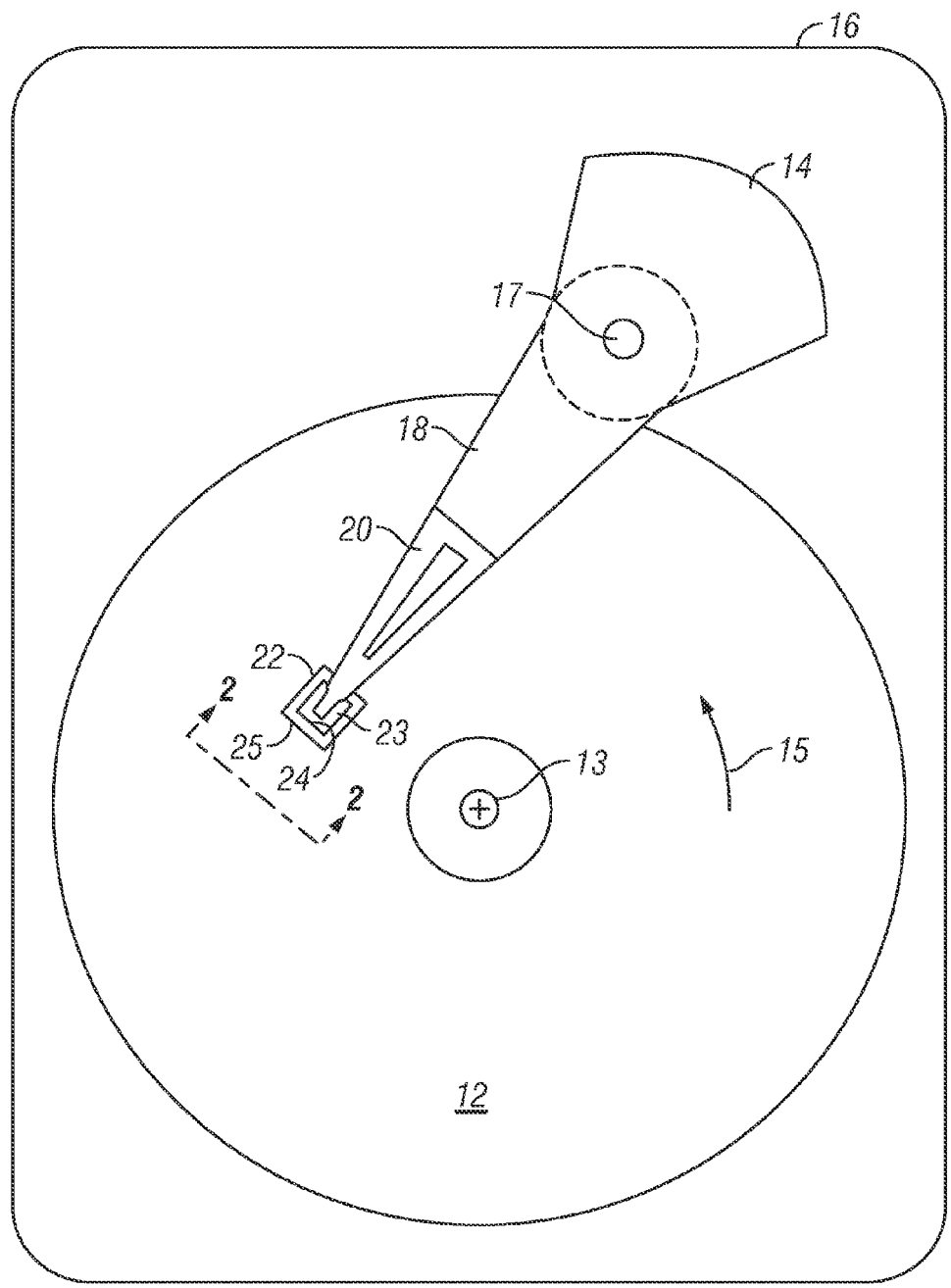
FIG. 1 is a schematic top view of a conventional magnetic recording hard disk drive with the cover removed.

The CPP magnetoresistive (MR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
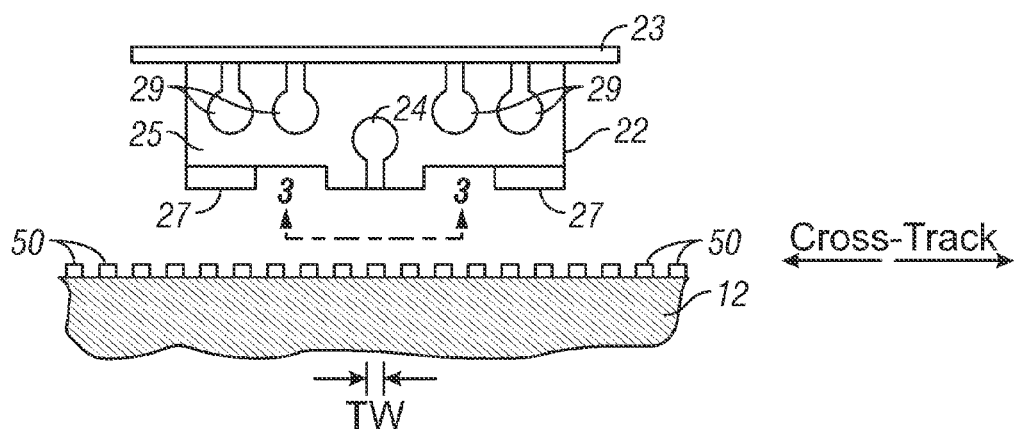
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
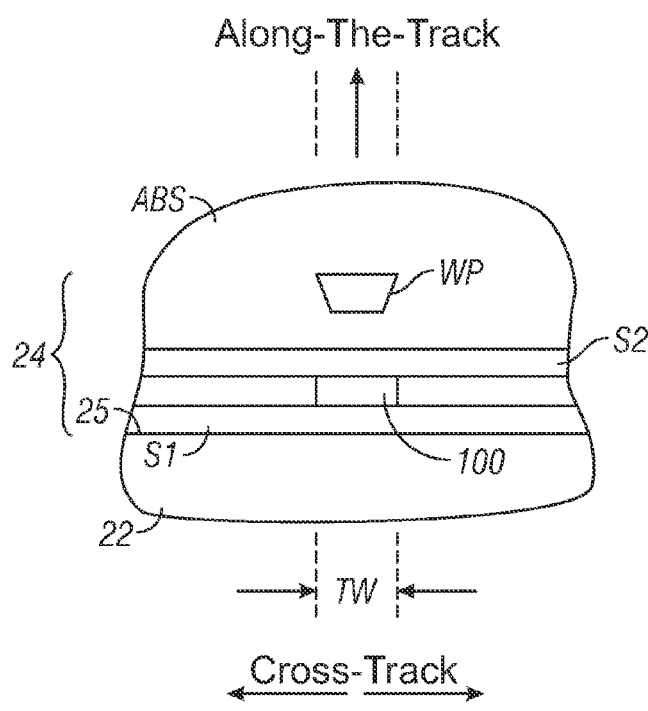
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material, typically a NiFe alloy, and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as ruthenium, tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
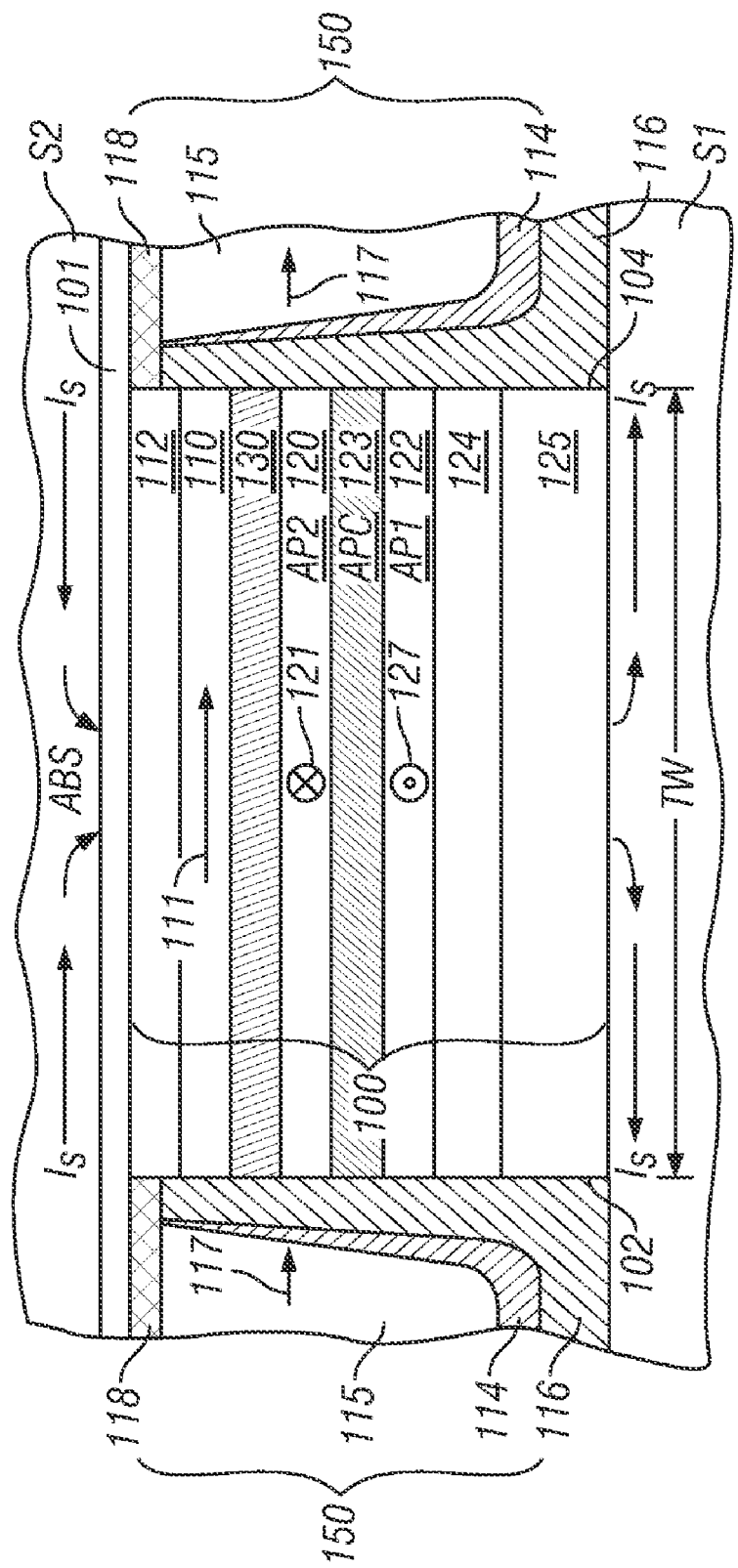
FIG. 4 is a cross-sectional schematic view of a CPP MR read head showing the stack of layers located between the magnetic shield layers.

FIG. 4 is view of the ABS showing the layers making up a CPP MR sensor structure as would be viewed from the disk. FIG. 4 will be used to describe the prior art sensor structure as well as the sensor structure according to this invention. Sensor 100 is a CPP MR read head comprising a stack of layers formed between the two magnetic shield layers S1, S2. The sensor 100 has a front edge at the ABS and spaced-apart side edges 102, 104 that define the track width (TW). The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2.

The sensor 100 layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110. The CPP MR sensor 100 may be a CPP GMR sensor, in which case the nonmagnetic spacer layer 130 would be formed of an electrically conducting material, typically a metal like Cu, Au or Ag. Alternatively, the CPP MR sensor 100 may be a CPP tunneling MR (CPP-TMR) sensor, in which case the nonmagnetic spacer layer 130 would be a tunnel barrier formed of an electrically insulating material, like $TiO_2$, MgO or $Al_2O_3$.

The pinned ferromagnetic layer in a CPP MR sensor may be a single pinned layer or an antiparallel (AP) pinned structure like that shown in FIG. 4. An AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's nonmagnetic spacer layer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. Instead of being in contact with a hard magnetic layer, AP1 by itself can be comprised of hard magnetic material so that AP1 is in contact with an underlayer on one side and the nonmagnetic APC layer on the other side. The AP-pinned structure minimizes the net magnetostatic coupling between the reference/pinned layers and the CPP MR free ferromagnetic layer. The AP-pinned structure, also called a "laminated" pinned layer, and sometimes called a synthetic antiferromagnet (SAF), is described in U.S. Pat. No. 5,465,185.

The pinned layer in the CPP GMR sensor in FIG. 4 is a well-known AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The AP1 and AP2 layers, as well as the free ferromagnetic layer 110, are typically formed of crystalline CoFe or NiFe alloys, amorphous or crystalline CoFeB alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. The AF layer 124 is typically a Mn alloy, e.g., PtMn, NiMn, FeMn, IrMn, PdMn, PtPdMn or RhMn. Alternatively, the AP-pinned structure may be "self-pinned" or it may be pinned by a hard magnetic layer such as $Co_{100-x}Pt_x$ or $Co_{100-x-y}Pt_xCr_y$ (where x is about between 8 and 30 atomic percent). Instead of being in contact with a hard magnetic layer, AP1 layer 122 by itself can be comprised of hard magnetic material so that it is in contact with an underlayer on one side and the nonmagnetic APC layer 123 on the other side. In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net magnetization of the AP-pinned structure, remains high. In the case of a hard magnet pinning layer, the hard magnet pinning layer moment needs to be accounted for when balancing the moments of AP1 and AP2 to minimize magnetostatic coupling to the free layer.

A seed layer 125 may be located between the lower shield layer S1 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, or a Ru/Ta/Ru, Ru/Ti/Ru, or Cu/Ru/Ta trilayer.

In the presence of an external magnetic field in the range of interest, i.e., magnetic fields from recorded data on the disk, the magnetization direction 111 of free layer 110 will rotate while the magnetization direction 121 of reference layer 120 will remain fixed and not rotate. Thus when a sense current $I_s$ is applied from top shield S2 perpendicularly through the sensor stack to bottom shield S1 (or from S1 to S2), the magnetic fields from the recorded data on the disk will cause rotation of the free-layer magnetization 111 relative to the reference-layer magnetization 121, which is detectable as a change in electrical resistance.

A hard magnet biasing structure 150 is formed outside of the sensor stack near the side edges 102, 104 of the sensor 100, particularly near the side edges of free layer 110. The structure 150 includes a ferromagnetic biasing layer 115 with high crystalline anisotropy ($K_u$) and thus high coercivity ($H_c$) and is thus also called the "hard bias" layer. The structure 150 also includes a seed layer below the biasing layer 115 and a capping layer 118 on the biasing layer 115. The structure 150 is electrically insulated from side edges 102, 104 of sensor 100 by a thin electrically insulating layer 116, which is typically alumina ($Al_2O_3$) but may also be a silicon nitride ($SiN_x$) or another metal oxide like a Ta oxide or a Ti oxide. The shield layer S1 serves as a substrate for the hard biasing structure 150, with the insulating layer 116 being located between the biasing structure 150 and S1. The seed layer 114 is deposited on the insulating layer 116. The biasing layer 115 has a magnetization 117 generally parallel to the ABS and thus longitudinally biases the magnetization 111 of the free layer 110. Thus in the absence of an external magnetic field the magnetization 117 of biasing layer 115 is parallel to the magnetization 111 of the free layer 110.

Figure 5:
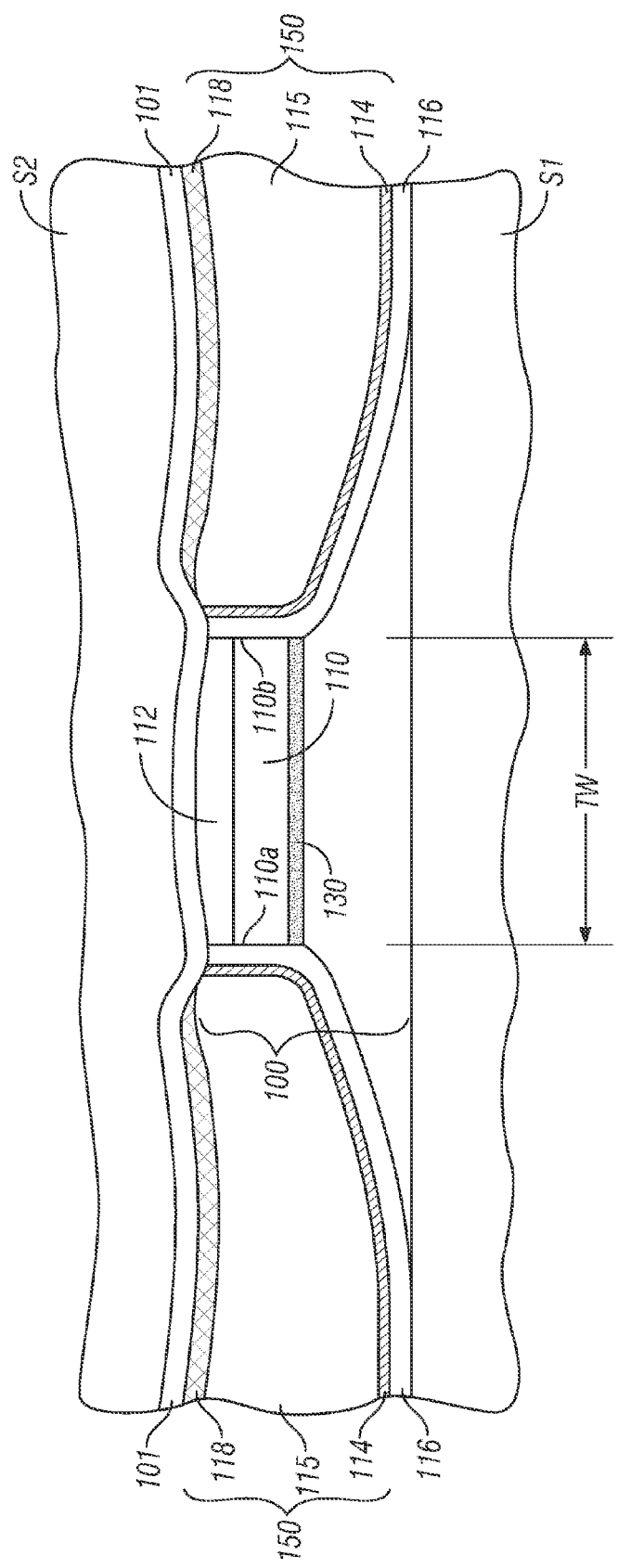
FIG. 5 is a line drawing based on a Scanning Transmission Electron Microscope (STEM) image of an actual sensor, and illustrates the hard magnet biasing structure according to this invention.

This invention is a CPP MR sensor like that described and shown in FIG. 4, but wherein the ferromagnetic biasing (hard bias) layer 115 is a chemically-ordered FePt $L1_0$ phase alloy, the seed layer 114 is a thin layer of iridium (Ir) or ruthenium (Ru), and the capping layer 118 is a thin layer of Ru or a bilayer of Ru/Ir. FIG. 5 is a line drawing based on a Scanning Transmission Electron Microscope (STEM) image of an actual sensor. The insulating layer 116 is preferably alumina and is deposited on S1 and on the TW edges 110a, 110b of free layer 110. However, the insulating layer may also be formed of a silicon nitride or another metal oxide like a Ta-oxide or a Ti-oxide. It may be preferable for insulating layer 116 to be thinner close to the TW edges of the free layer to get the hard bias layer 115 closer for higher effective field, but thicker away from the free layer on S1 to obtain good insulating properties and avoid electrical shunting. A typical thickness of insulating layer 116 is about 20 to 40 Å close to the TW edges of the free layer and about 30 to 50 Å away from the free layer on S1. The seed layer 114 is a layer of Ir or Ru and is deposited by sputtering or ion-beam deposition (IBD) to a thickness between 5-40 Å, preferably between 10-25 Å. The hard bias layer 115 is a chemically-ordered FePt L1$_0$ phase binary alloy. The FePt is deposited by sputtering directly onto the seed layer 114 to a thickness between about 130-200 Å. As deposited, the FePt is a face-centered-cubic (fcc) disordered alloy with relatively low anisotropy ($K_u$) (approximately $10^5$ erg/cm$^3$) and with Pt content preferably between 43-48 atomic percent. The capping layer 118 is a layer of Ru or a bilayer of Ru/Ir deposited by sputtering or IBD directly on the hard bias layer 115 to a thickness between about 40-100 Å. After deposition of the layers 114, 115, 118, the structure 150 is annealed at a temperature of at least 270° C. for at least 5 hours. A higher annealing temperature generally requires a shorter annealing time. The annealing converts the FePt to a chemically-ordered L1$_0$ (fct) phase alloy with high $K_u$ and thus high FL (greater than 3500 Oe) and with the easy axis of magnetization (the c-axis) oriented in the plane of the layer. The annealing was done in the presence of a 5 Tesla magnetic field perpendicular to the ABS in order not to disturb the pinned layer magnetization direction, which had been already established during a separate sensor annealing step. However, the sensor annealing to establish the pinned layer magnetization direction could be done at the same time as the hard bias annealing.

Figure 6:
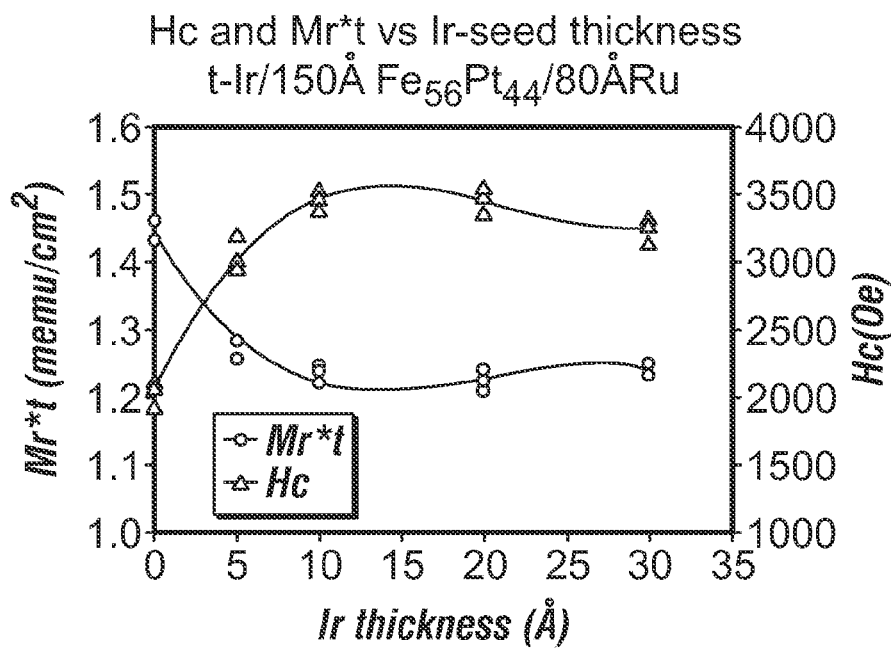
FIG. 6 is a graph showing in-plane remanent magnetization-thickness product ($M_r t$) and coercivity ($H_c$) of the hard bias layer as a function of iridium (Ir) seed layer thickness for a hard magnet biasing structure according to the invention.

As the data density increases in magnetic recording disk drives, there is a requirement for a decrease in the read head dimensions, particularly the shield-to-shield (S1-to-S2) spacing. However, even as S1-to-S2 spacing is reduced it is desirable to maximize the remanence-thickness product ($M_r$t) of hard bias layer 115 to assure magnetic stabilization of the free layer 110. This means that it is desirable to have seed layer 114 as thin as possible while still permitting growth of the hard bias layer 115 with adequate magnetic properties, such as $H_c$, $M_r$t and squareness (S=$M_r$/$M_s$). Also it is desirable to have the seed layer structure as thin as possible to minimize free layer to hard bias layer spacing and thus to increase free layer stabilization due to increased magnetostatic coupling. In this invention, the thickness of the seed layer 114 can be less than 40 Å, which is approximately the minimum thickness of prior art seed layers, and as thin as about 10 Å. FIG. 6 is a graph showing $M_r$t and $H_c$ as a function of Ir seed layer thickness (t) for a hard magnet biasing structure of:

t-Ir (seed)/150 Å Fe$_{56}$Pt$_{44}$ (hard bias)/80 Å Ru (capping).

FIG. 6 illustrates that the Ir seed layer can be as thin as about 10 Å and still achieve a hard bias layer with an $H_c$ of about 3500 Oe and $M_r$t of about 1.2 memu/cm$^2$. Similar results have been obtained with a Ru seed layer.

The effect of Ru capping layer thickness (t) on $M_r$t and $H_c$ was also measured for a hard magnet biasing structure of:

15 Å Ir or Ru (seed)/150 Å Fe$_{56}$Pt$_{44}$ (hard bias)/t-Ru (capping).

For structures with either the Ir or Ru 15 Å seed layer, a hard bias layer with FL of about 3000 Oe was achieved for a Ru capping layer thickness as thin as about 40 Å. A hard bias layer with $H_c$ of about 3500 Oe was achieved for a Ru capping layer between 60-80 Å, with no significant improvement in $H_c$ above about 80 Å. Similar results were obtained with a Ru/Ir bilayer, specifically a 60 Å Ru/20 Å Ir bilayer as the capping layer. Measurements of $M_r$t for the same structures showed that a hard bias layer with $M_r$t greater than 1.2 memu/cm$^2$ can be achieved with Ru or Ru/Ir capping layer thicknesses of between 30-90 Å with a 15 Å Ir seed layer and greater than 1.3 memu/cm$^2$ with a 15 Å Ru seed layer.

Figure 7:
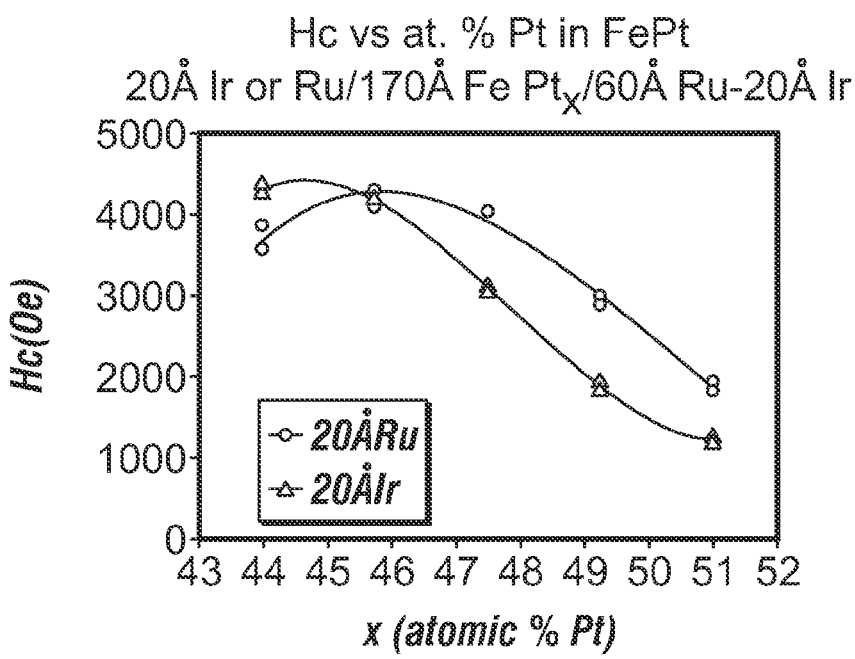
FIG. 7 is a graph showing $H_c$ of the FePt alloy hard bias layer as a function of atomic percent Pt as deposited (before annealing) for a hard magnet biasing structure according to the invention.

The effect of atomic percent Pt in the FePt alloy on $H_c$ and $M_r$t was also measured. FIG. 7 shows $H_c$ as a function of atomic percent Pt for various structures of the form:

20 Å Ir or Ru (seed)/170 Å Fe$_{(100-x)}$Pt$_x$ (hard bias)/60 Å Ru-20 Å Ir (capping).

FIG. 7 shows that for a structure with a Ir seed layer and a FePt alloy with between about 43-46 atomic percent Pt as deposited (before annealing), the highest $H_c$ is achieved (about 4000-4500 Oe). For a structure with a Ru seed layer and a FePt alloy with between about 44-48 atomic percent Pt as deposited (before annealing), the highest $H_c$ is achieved (about 3500-4000 Oe). Measurements of $M_r$t for the same structures showed that for a structure with a Ir seed layer and a FePt alloy with between about 43-46 atomic percent Pt, the highest $M_r$t is achieved (about 1.35-1.40 memu/cm$^2$). For a structure with a Ru seed layer and a FePt alloy with between about 44-48 atomic percent Pt, the highest $M_r$t is achieved (about 1.40-1.50 memu/cm$^2$).

Also, for all the examples with a FePt hard bias layer between about 130-180 Å, and with a Ru or Ir seed layer between about 10-40 Å, the squareness S was greater than or equal to 0.85 and did not vary significantly with FePt thickness but was relatively constant, generally about 0.87 to 0.89.

The MR sensor structure with the hard biasing structure according to this invention has been described above with respect to its application in a CPP GMR or TMR read head for a magnetic recording disk drive. However, the sensor structure is also applicable to other types of MR sensors, such as for use in automotive applications and as magnetometers.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor structure comprising:
   a substrate;
   a magnetoresistive sensor on the substrate and comprising a stack of layers including a ferromagnetic free layer, the free layer having a front edge, a back edge recessed from the front edge, and two spaced-apart side edges;
   an electrically insulating layer on and in contact with the side edges of the free layer and on regions of the substrate adjacent the sensor;
   a seed layer consisting of material selected from Ir and Ru on and in contact with the insulating layer;
   a layer of ferromagnetic chemically-ordered FePt alloy on and in contact with the seed layer, the FePt alloy having a face-centered-tetragonal structure with its c-axis generally in the plane of the layer; and
   a capping layer comprising a Ru layer on and in contact with the FePt alloy layer.

2. The sensor structure of claim 1 wherein the seed layer has a thickness equal to or greater than 10 Å and less than or equal to 40 Å.

3. The sensor structure of claim 1 wherein the capping layer consists of a Ru layer having a thickness equal to or greater than 40 Å and less than or equal to 100 Å.

4. The sensor structure of claim 1 wherein the capping layer further comprises a Ir layer on and in contact with the Ru layer.

5. The sensor structure of claim 4 wherein the total thickness of the capping layer is equal to or greater than 40 Å and less than or equal to 100 Å.

6. The sensor structure of claim 1 wherein the FePt alloy as deposited has a composition of the form $Fe_{(100-x)}Pt_x$, where x is atomic percent and is greater than or equal to 43 and less than or equal to 48.

7. The sensor structure of claim 1 wherein the FePt alloy has a thickness equal to or greater than 130 Å and less than or equal to 200 Å.

8. The sensor structure of claim 1 wherein the FePt alloy layer has a coercivity $H_c$ greater than 3500 Oe.

9. The sensor structure of claim 1 wherein the FePt alloy layer has a ratio (S) of remanent magnetization ($M_r$) to saturation magnetization ($M_s$) greater than 0.85.

10. The sensor structure of claim 1 wherein the FePt alloy layer has a remanent magnetization-thickness product ($M_r t$) greater than 1.2 memu/cm$^2$.

11. The sensor structure of claim 1 wherein the insulating layer is formed of a material selected from an aluminum oxide, a tantalum oxide, a titanium oxide, and a silicon nitride.

12. The sensor structure of claim 1 wherein the substrate is a first shield layer formed of magnetically permeable material and further comprising a second shield layer of magnetically permeable material on the sensor stack and capping layer.

13. The sensor structure of claim 1 wherein the sensor is a giant magnetoresistance (GMR) sensor.

14. The sensor structure of claim 1 wherein the sensor is a tunneling magnetoresistance (TMR) sensor.

15. A current-perpendicular-to-the-plane (CPP) magnetoresistive (MR) read head for a magnetic recording disk drive comprising:
   a substrate;
   a first shield layer of magnetically permeable material on the substrate;
   a sensor stack of layers including a ferromagnetic free layer on the first shield layer and having two spaced-apart side edges, the free layer having a magnetization free to rotate in the presence of magnetic fields from recorded data on a disk;
   an electrically insulating layer on and in contact with the side edges of the free layer and on regions of the first shield layer adjacent the sensor stack;
   a hard magnetic structure comprising:
      a seed layer consisting of material selected from Ir and Ru on and in contact with the insulating layer, the seed layer having a thickness equal to or greater than 10 Å and less than or equal to 25 Å;
      a layer of ferromagnetic chemically-ordered FePt alloy deposited on and in contact with the seed layer for biasing the magnetization of the free layer and having a composition as deposited of the form $Fe_{(100-x)}Pt_x$ where x is atomic percent and is greater than or equal to 43 and less than or equal to 48, the FePt alloy having a face-centered-tetragonal structure with its c-axis generally in the plane of the layer; and
      a capping layer comprising a Ru layer on and in contact with the FePt alloy layer and having a thickness equal to or greater than 40 Å and less than or equal to 100 Å; and
   a second shield layer of magnetically permeable material on the sensor stack and capping layer.

16. The read head of claim 15 wherein the FePt alloy layer has a coercivity greater than 3500 Oe.

17. The read head of claim 15 wherein the FePt alloy layer has a ratio (S) of remanent magnetization ($M_r$) to saturation magnetization ($M_s$) greater than 0.85.

18. The read head of claim 15 wherein the FePt alloy layer has a remanent magnetization-thickness product ($M_r t$) greater than 1.2 memu/cm$^2$.

19. The read head of claim 15 wherein the insulating layer is formed of a material selected from an aluminum oxide, a tantalum oxide, a titanium oxide, and a silicon nitride.

20. The read head of claim 15 wherein the CPP MR read head is a giant magnetoresistance (GMR) read head.

21. The read head of claim 15 wherein the CPP MR read head is a tunneling magnetoresistance (TMR) read head.

* * * * *